United States Patent
Miyachi et al.

(10) Patent No.: US 9,680,063 B2
(45) Date of Patent: Jun. 13, 2017

(54) SEMICONDUCTOR LIGHT-EMITTING DEVICE AND SEMICONDUCTOR LIGHT-EMITTING DEVICE ARRAY

(71) Applicant: STANLEY ELECTRIC CO., LTD., Meguro-ku, Tokyo (JP)

(72) Inventors: Mamoru Miyachi, Okegawa (JP); Noriko Nihei, Sagamihara (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/144,267

(22) Filed: May 2, 2016

(65) Prior Publication Data

US 2016/0336479 A1 Nov. 17, 2016

(30) Foreign Application Priority Data

May 14, 2015 (JP) .................................. 2015-098880

(51) Int. Cl.

| | |
|---|---|
| H01L 33/00 | (2010.01) |
| H01L 33/06 | (2010.01) |
| H01L 33/12 | (2010.01) |
| H01L 33/50 | (2010.01) |
| H01L 33/56 | (2010.01) |
| H01L 33/58 | (2010.01) |
| H01L 33/38 | (2010.01) |
| H01L 33/08 | (2010.01) |
| H01L 33/22 | (2010.01) |
| H01L 33/44 | (2010.01) |
| F21S 8/10 | (2006.01) |

(52) U.S. Cl.
CPC ............ *H01L 33/382* (2013.01); *H01L 33/08* (2013.01); *F21S 48/115* (2013.01); *H01L 33/22* (2013.01); *H01L 33/44* (2013.01)

(58) Field of Classification Search
None
See application file for complete search history.

(56) References Cited

U.S. PATENT DOCUMENTS

2010/0193813 A1* 8/2010 Kao ........................ H01L 33/20
257/98
2011/0127491 A1 6/2011 Jung et al.
(Continued)

FOREIGN PATENT DOCUMENTS

| JP | 2011119734 A | 6/2011 |
|---|---|---|
| JP | 2013501350 A | 1/2013 |

*Primary Examiner* — Khaja Ahmad
(74) *Attorney, Agent, or Firm* — Holtz, Holtz & Volek PC

(57) ABSTRACT

A semiconductor light-emitting device comprises an optical semiconductor multilayer disposed above a support substrate, which has a structure in which a first semiconductor layer having a first conductivity type, an active layer having light emitting properties, and a second semiconductor layer having a second conductivity type different from the first conductivity type are sequentially stacked from the support substrate side, in which a groove, which has a height exceeding at least the active layer from the support substrate side, is formed along an outer edge of the optical semiconductor multilayer, and which includes an external region being a region further outside than the groove, an inner region being a region further inside than the groove, and a connection region corresponding to a region where the groove is provided, in plan view.

13 Claims, 13 Drawing Sheets

(56) References Cited

U.S. PATENT DOCUMENTS

2011/0215294 A1* 9/2011 Suzuki ................... H01L 33/06
                                                      257/13
2011/0266579 A1* 11/2011 Nagai ................... H01L 27/156
                                                      257/98
2012/0267662 A1   10/2012 Maute et al.

* cited by examiner

SEMICONDUCTOR LIGHT-EMITTING DEVICE AND SEMICONDUCTOR LIGHT-EMITTING DEVICE ARRAY

CROSS REFERENCE TO RELATED APPLICATION

This application is based on and claims priority on Japanese Patent Application 2015-098880, filed on May 14, 2015, the entire contents of which are incorporated herein by reference.

FIELD OF THE INVENTION

The invention relates to a semiconductor light-emitting device, and a semiconductor light-emitting device array which includes a plurality of semiconductor light-emitting devices.

BACKGROUND

A semiconductor light-emitting device which uses a nitride semiconductor such as GaN is capable of emitting ultraviolet light or blue light, and is also capable of emitting white light when using phosphors (for example, Japanese Laid-open Patent Publications No. 2011-119734 and No. 2013-501350). Such a semiconductor light-emitting device can be used for lighting tools and more specifically lighting tools for a vehicle or the like.

Recently, a technology for a vehicle headlamp has been focused in which a light distribution shape is controlled in real time depending on circumstances in front of a vehicle, that is, the presence/absence of oncoming vehicles, vehicles ahead, or the like and positions thereof. Such a technology is generally referred to as adaptive driving beam (ADB), adaptive front lighting system (AFS), or the like. In the ADB or AFS, for example, a plurality of semiconductor light-emitting devices which are capable of independently performing on/off control are used.

SUMMARY

According to an aspect of this invention, there is provided a semiconductor light-emitting device comprising: a support substrate; an optical semiconductor multilayer disposed above the support substrate, which has a structure in which a first semiconductor layer having a first conductivity type, an active layer having light emitting properties, and a second semiconductor layer having a second conductivity type different from the first conductivity type are sequentially stacked from the support substrate side, in which a groove, which has a height exceeding at least the active layer from the support substrate side, is formed along an outer edge of the optical semiconductor multilayer, and which includes an external region being a region further outside than the groove, an inner region being a region further inside than the groove, and a connection region corresponding to a region where the groove is provided, in plan view; a first electrode disposed between the support substrate and the optical semiconductor multilayer and having a portion in contact with the first semiconductor layer in the inner region; and a second electrode disposed between the support substrate and the optical semiconductor multilayer, and having a portion which penetrates the first electrode, the first semiconductor layer and the active layer and being in contact with the second semiconductor layer, in the inner region, wherein, in the optical semiconductor multilayer, the connection region includes a member having a refractive index greater than the air, and the member causes the second semiconductor layer in the inner region to be coupled to the second semiconductor layer in the external region.

According to another aspect of this invention, there is provided a semiconductor light-emitting device array comprising: a mounting substrate; a plurality of semiconductor light-emitting devices disposed on the mounting substrate; and a protection layer covering the plurality of semiconductor light-emitting devices and including phosphor material, wherein each of the semiconductor light-emitting devices includes a support substrate, an optical semiconductor multilayer disposed above the support substrate, which a structure in which a first semiconductor layer having a first conductivity type, an active layer having light emitting properties, and a second semiconductor layer having a second conductivity type different from the first conductivity type are sequentially stacked from the support substrate side, in which a groove, which has a height exceeding at least the active layer from the support substrate side, is formed along a side close to an adjacent semiconductor light-emitting device, and which includes an outer region being a region close to the adjacent semiconductor light-emitting device than the groove, a main region which is a region further away from the adjacent semiconductor light-emitting device than the groove, and a connection region corresponding to a region where the groove is provided, in plan view, a first electrode disposed between the support substrate and the optical semiconductor multilayer and having a portion in contact with the first semiconductor layer in the main region, and a second electrode disposed between the support substrate and the optical semiconductor multilayer, and having a portion which penetrates the first electrode, the first semiconductor layer and the active layer and being in contact with the second semiconductor layer, in the main region.

DESCRIPTION OF THE PREFERRED EMBODIMENTS

A first semiconductor light-emitting device (LED element) which is discussed by inventors will be described.

First, a method of manufacturing a first LED element will be described with reference to FIG. 1A to FIG. 1K. The first LED element is mainly manufactured as follows; a device structure layer including an optical semiconductor multilayer is formed on a growth substrate (FIG. 1A to FIG. 1F), the device structure layer is bonded to a support substrate, the growth substrate is separated from the device structure layer (FIG. 1G and FIG. 1H), and finally the support substrate is divided in an appropriate size (FIG. 1I). Relative sizes, positional relationships, or the like between various constituents illustrated in drawings are different from those in actuality.

Figure 1A:
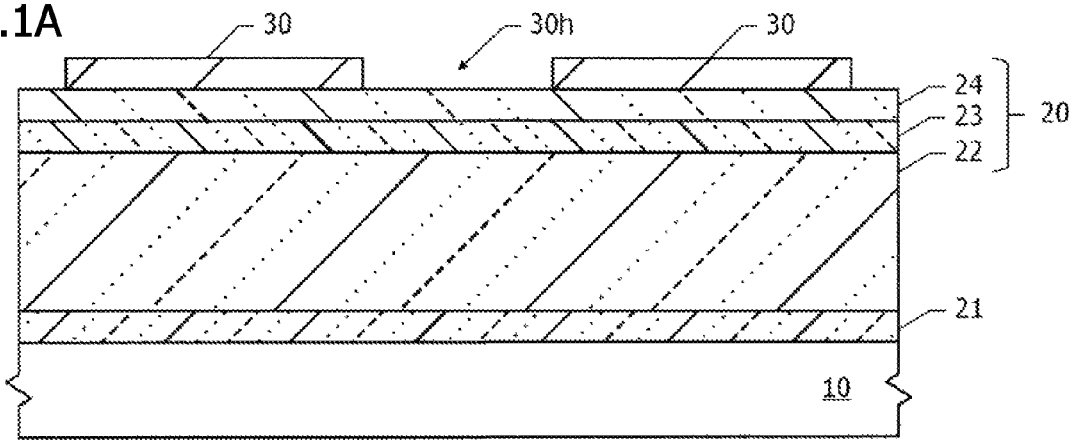
FIG. 1A to FIG. 1J are sectional views illustrating a state of manufacturing a first semiconductor light-emitting device.

First, a growth substrate 10 is prepared (refer to FIG. 1A). The growth substrate 10 is, for example, a sapphire substrate, a spinel substrate, or a zinc oxide (ZnO) substrate. The prepared growth substrate 10 is thermally cleaned. Specifically, under a hydrogen atmosphere, the growth substrate 10 is heated at 1000° C. for ten minutes.

Next, as illustrated in FIG. 1A, a nitride semiconductor layer (optical semiconductor multilayer 20), which is expressed by $Al_xIn_yGa_{1-x-y}N$ ($0 \leq x \leq 1$ and $0 \leq y \leq 1$), is formed on the growth substrate 10 by metal organic chemical vapor deposition (MOCVD).

Specifically, first, a temperature of the substrate is set at 500° C., and trimethyl gallium (TMG) is supplied at a flow rate of 10.4 μmol/min and $NH_3$ is supplied at a flow rate of 3.3 SLM for three minutes. Accordingly, a buffer layer made of GaN is grown on the growth substrate 10. Subsequently, the temperature of the substrate is set to 1000° C., and the buffer layer is crystallized.

After that, while maintaining the temperature of the substrate, TMG is supplied at a flow rate of 45 μmol/min and $NH_3$ is supplied at a flow rate of 4.4 SLM for 20 minutes. Accordingly, an underlying layer made of GaN is grown on the buffer layer. The buffer layer and the underlying layer constitute an underlying buffer layer 21.

After that, while maintaining the temperature of the substrate, TMG is supplied at a flow rate of 45 μmol/min, $NH_3$ is supplied at a flow rate of 4.4 SLM, and $SiH_4$ is supplied at a flow rate of $2.7 \times 10^{-9}$ μmol/min for 120 minutes. Accordingly, a Si-doped GaN layer (n-type GaN layer) having a thickness of substantially 7 μm is grown on the underlying buffer layer 21. The n-type GaN layer constitutes an n-type semiconductor layer 22.

After that, the temperature of the substrate is raised to 700° C., and TMG is supplied at a flow rate of 3.6 μmol/min, trimethyl indium (TMI) is supplied at a flow rate of 10 μmol/min, and $NH_3$ is supplied at a flow rate of 4.4 SLM for 33 seconds, and thus a well layer (thickness thereof is substantially 2.2 nm) made of InGaN is grown. Subsequently, a supply of TMI is stopped, TMG and $NH_3$ are supplied for 320 seconds, and a barrier layer (thickness thereof is substantially 15 nm) made of GaN is grown. The well layer and the barrier layer are repeatedly alternatively grown (for example, five cycles), and an active layer 23 which includes a multi-quantum well structure is formed on the n-type semiconductor layer 22.

After that, the temperature of the substrate is raised to 870° C., and TMG is supplied at a flow rate of 8.1 μmol/min, $NH_3$ is supplied at a flow rate of 4.4 SLM, and bis cyclopentadienyl magnesium (CP2Mg) is supplied at a flow rate of $2.9 \times 10^{-7}$ μmol/min for five minutes. Accordingly, a Mg-doped GaN layer (p-type GaN layer) having a thickness of substantially 500 nm is grown on the active layer 23. The p-type GaN layer constitutes a p-type semiconductor layer 24.

In this way, the optical semiconductor multilayer 20 is formed on the growth substrate 10 through with the underlying buffer layer 21 in between. The optical semiconductor multilayer 20 has a structure in which the n-type semiconductor layer 22, the active layer 23, and the p-type semiconductor layer 24 are sequentially stacked.

Next, a p-side electrode (surface electrode) 30 including an opening 30h is formed on a surface of the optical semiconductor multilayer 20 (p-type semiconductor layer 24) by a lift-off process. The p-side electrode 30 is made of a conductive multilayered film of, for example, an indium tin oxide (ITO) film, a Ag film, a TiW film, a Ti film, a Pt film, a Au film, and a Ti film. The p-side electrode 30 is electrically connected to the p-type semiconductor layer 24 on a surface of the p-type semiconductor layer 24.

Figure 1B:
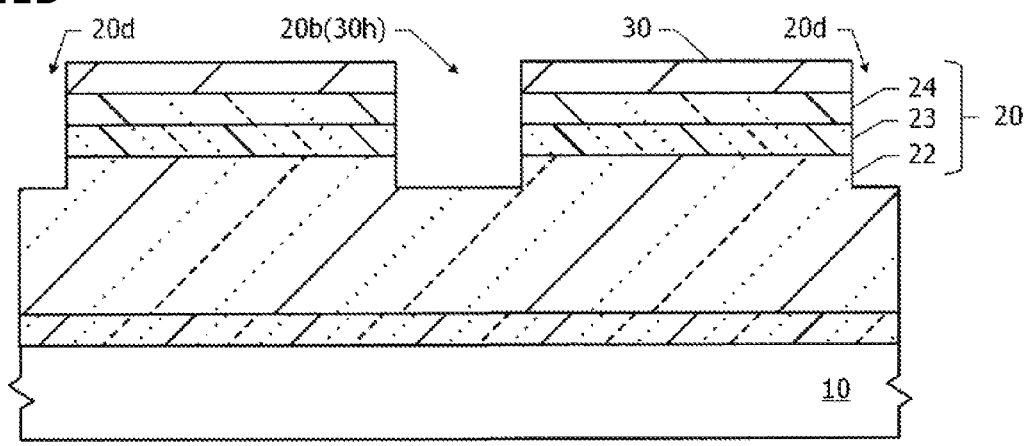

Next, as illustrated in FIG. 1B, regions of the optical semiconductor multilayer 20 where the p-side electrode 30 is not formed, that is, a region corresponding to the opening 30h and a region further outside than the p-side electrode 30 are removed by dry etching with chlorine gas using a resist mask. Accordingly, a via 20b and an outer groove 20d are formed in the optical semiconductor multilayer 20. The via 20b and the outer groove 20d penetrate at least the p-type semiconductor layer 24 and the active layer 23, and the n-type semiconductor layer 22 is exposed at the bottom of the via 20b and the outer groove 20d.

Figure 1C:
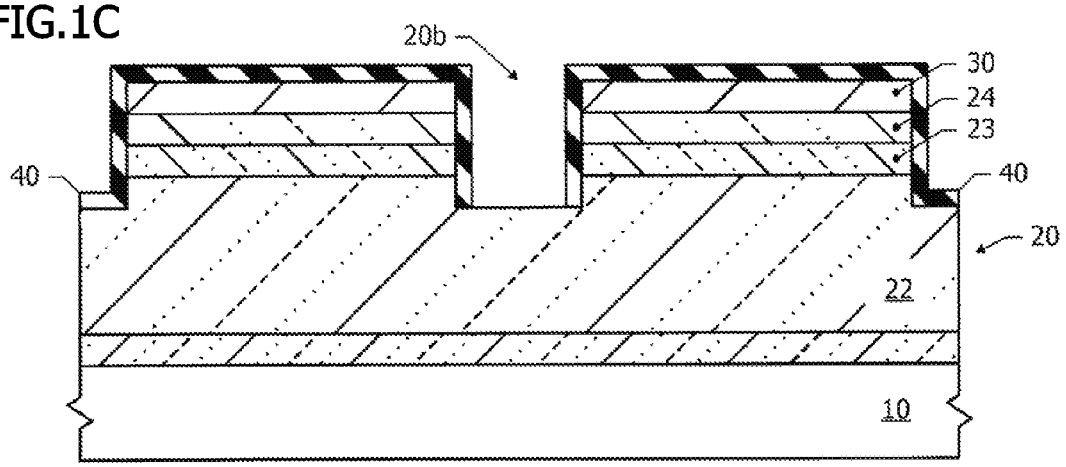

Next, as illustrated in FIG. 1C, a float layer 40 is formed in a region other than the bottom surface of the via 20b. First, by sputtering or the like, a $SiO_2$ film having a thickness of substantially 300 nm is formed on the entire upper surface of the optical semiconductor multilayer 20 including the p-side electrode 30. Note that a SiN film or the like may be formed instead of the $SiO_2$ film. Subsequently, the $SiO_2$ film formed on the bottom surface of the via 20b is etched by dry etching with $CF_4/Ar$ mixed gas using a resist mask. As a result, at the bottom of the via 20b, the n-type semiconductor layer 22 is exposed. Accordingly, a $SiO_2$ film which covers at least the p-side electrode 30 and a side surface of the via 20b, that is, the float layer 40 is formed.

Figure 1D:
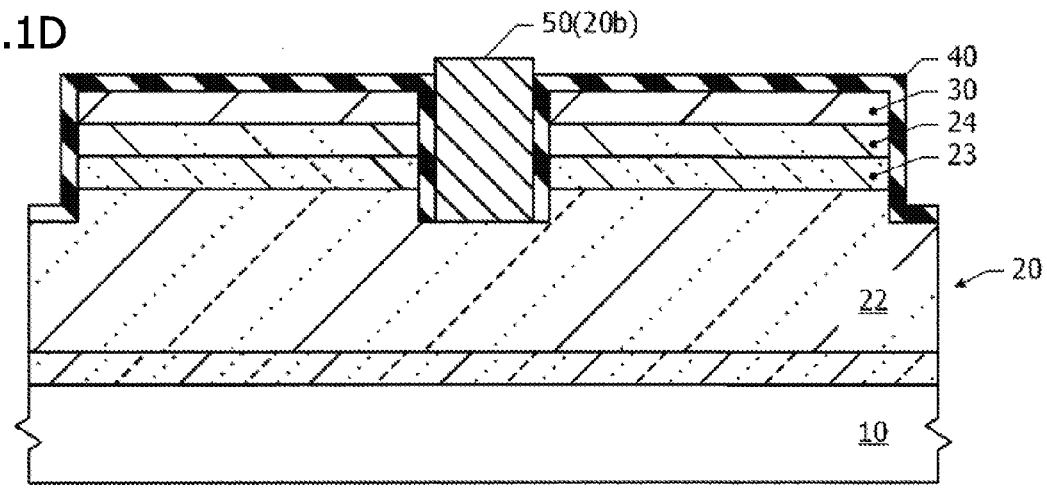

Next, as illustrated in FIG. 1D, an n-side electrode (via electrode) 50 is formed inside the via 20b by a lift-off process. The n-side electrode 50 is made of a metal multilayered film of, for example, a Ti film, an Al film, a Ti film, a Pt film, and a Au film. The n-side electrode 50 is electrically connected to the n-type semiconductor layer 22 at the bottom surface of the via 20b. Since the side surface of the via 20b is covered by the float layer 40, the n-side electrode 50 is not in contact with the p-side electrode 30, the active layer 23, and the p-type semiconductor layer 24.

Figure 1E:
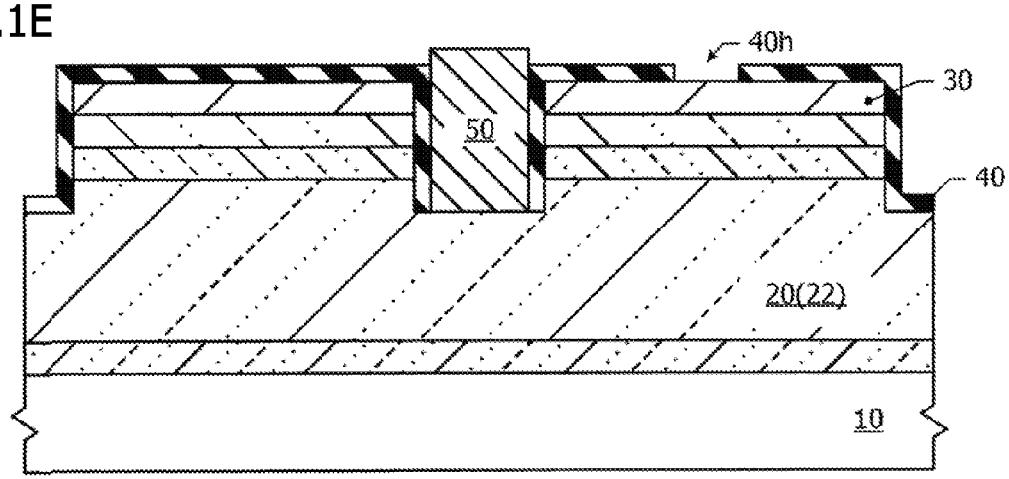

Next, as illustrated in FIG. 1E, by dry etching with chlorine gas using a resist mask, a part of the float layer 40 positioned over the p-side electrode 30 is removed, and a part of the p-side electrode 30 is exposed (contact hole 40h).

Figure 1F:
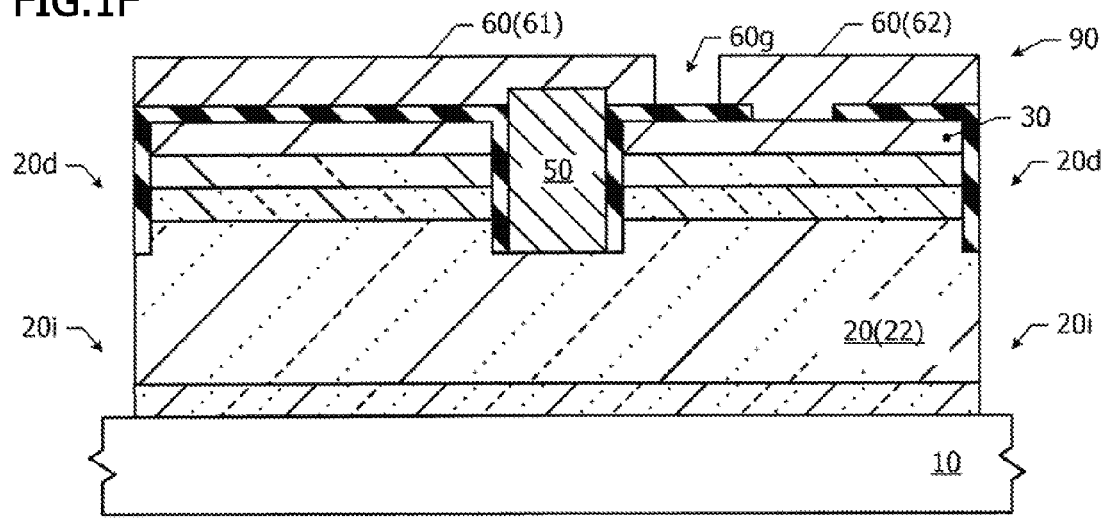

Next, as illustrated in FIG. 1F, a conductive layer 60, which is made of a metal multilayered film of a Ti film, a Pt film, and a Au film, is formed on the float layer 40 by a lift-off process. The conductive layer 60 includes an n-side part 61 in contact with the n-side electrode 50 and a p-side part 62 in contact with the p-side electrode 30 through the contact hole 40h (refer to FIG. 1E). The n-side part 61 and the p-side part 62 are formed with a gap 60g therebetween, and are electrically insulated from each other.

After that, a separating groove 20i through the float layer 40 and the optical semiconductor multilayer 20 (n-type semiconductor layer 22) is formed in the outer groove 20d by dry etching with chlorine gas using a resist mask. The separating groove 20i demarcates an outer edge of the optical semiconductor multilayer 20 (LED element). The optical semiconductor multilayer 20 has, for example, a square shape in plan view in which one side thereof is substantially 1 mm.

In this way, a device structure layer 90 which includes constituents from the optical semiconductor multilayer 20 to the conductive layer 60 is formed on the growth substrate 10. In the drawings hereinafter, an arrangement of the growth substrate 10 and the device structure layer 90 is illustrated upside down, for the sake of convenience.

Figure 1G:
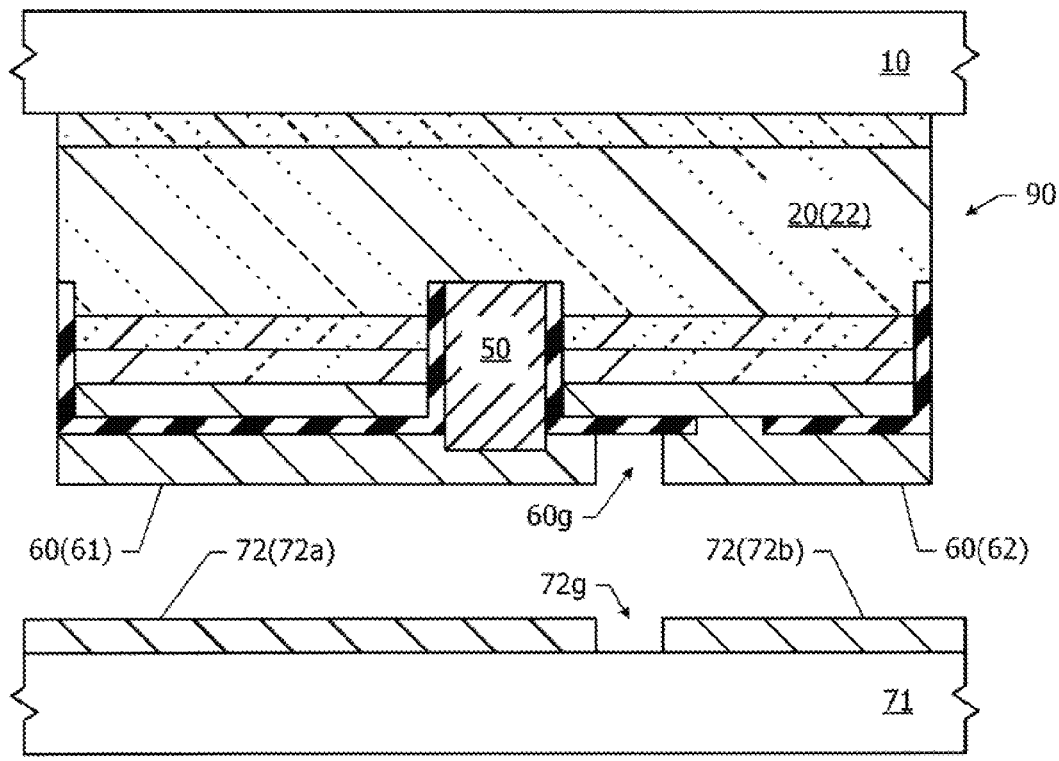

Next, a support substrate 71 for supporting the device structure layer 90 is prepared (refer to FIG. 1G). The support substrate 71 is a substrate made of, for example, Si, Ge, Mo, CuW, AlN, or the like. A bonding layer 72 is formed on a surface of the support substrate 71. The bonding layer 72 is made of, for example, AuSn (Sn: 20 wt %).

The bonding layer 72 includes a first part 72a and a second part 72b. The first part 72a and the second part 72b are patterned with a gap 72g therebetween, and are electrically insulated from each other.

Next, as illustrated in FIG. 1G, the prepared support substrate 71 and the device structure layer 90 manufactured in advance are arranged so that the bonding layer 72 faces the conductive layer 60. At this time, the bonding layer 72 and the conductive layer 60 are arranged so that a position of the gap 72g of the bonding layer 72 coincides with a position of the gap 60g of the conductive layer 60, and also the n-side part 61 faces the first part 72a and the p-side part 62 faces the second part 72b.

Figure 1H:
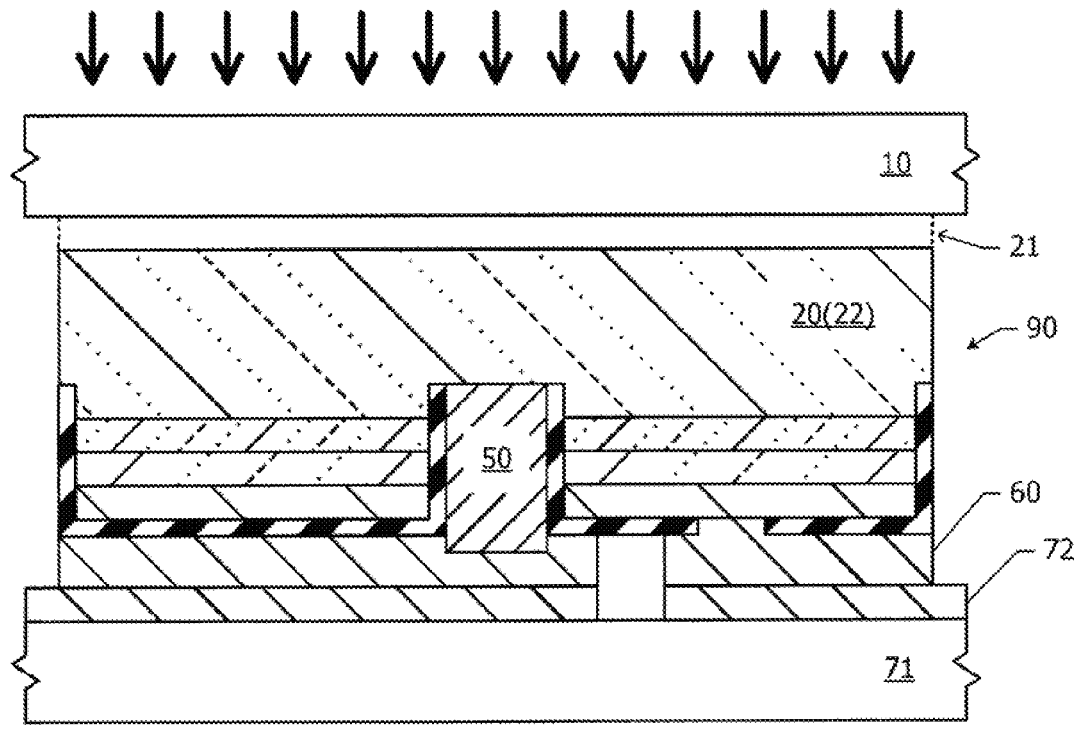
Figure 1I:
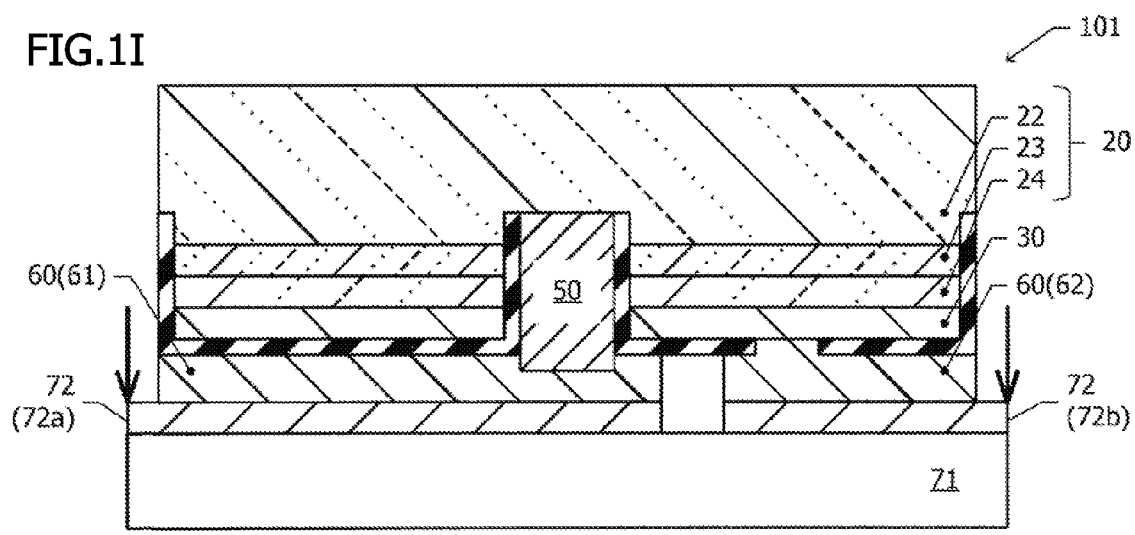
Figure 1J:
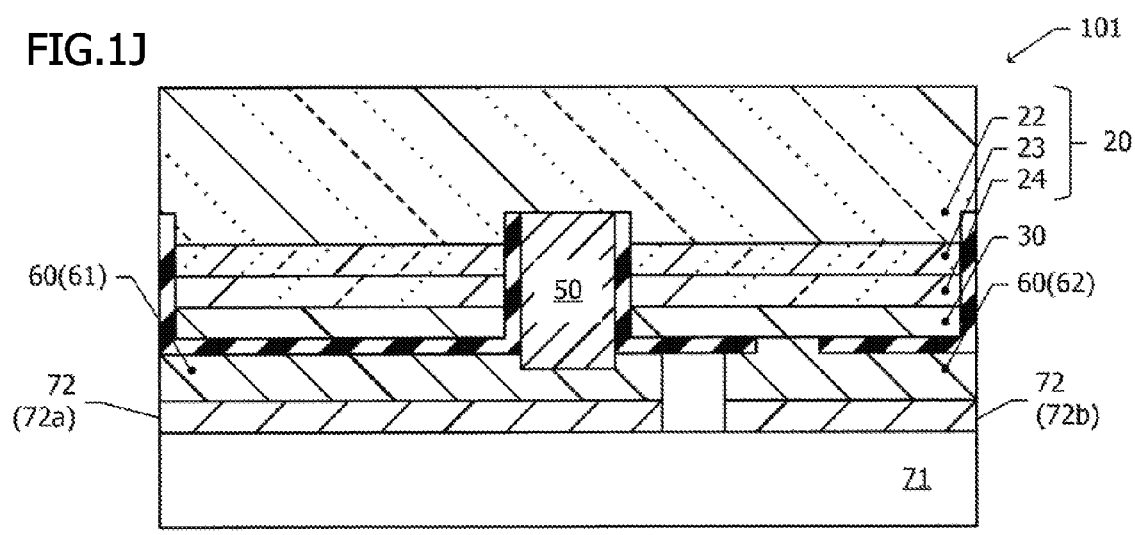

Next, as illustrated in FIG. 1H, the support substrate 71 and a device structure layer 90 are bonded to each other, and are maintained for ten minutes in a state of being heated at 300° C. while being pressurized at 3 MPa. Subsequently, the substrate and the body bonded are cooled to room temperature, and the bonding layer 72 and the conductive layer 60 are fusion-bonded.

After that, the growth substrate 10 and the device structure layer 90 (optical semiconductor multilayer 20) are separated from each other by a laser lift-off process. Specifically, KrF excimer laser light (wavelength is 248 nm and radiation energy density is 800 mJ/cm$^2$ to 900 mJ/cm$^2$) is applied from the growth substrate 10 (sapphire substrate) side.

The laser light is transmitted through the growth substrate 10, and is absorbed in the underlying buffer layer 21 (GaN layer). The underlying buffer layer 21 is dissolved by heat generated due to light absorption. Accordingly, the growth substrate 10 and the optical semiconductor multilayer 20 are separated, and the n-type semiconductor layer 22 is exposed.

Finally, as illustrated in FIG. 1I, the support substrate 71 is separated along the outer edge of the optical semiconductor multilayer 20 by laser scribing or dicing, and each LED element 101 is obtained. A separating position of the support substrate 71 is illustrated by an arrow in FIG. 1I. In this way, the first LED element 101 is complete.

In this manufacturing method, a part of the optical semiconductor multilayer 20 is removed in a process illustrated in FIG. 1B, and the outer edge of the optical semiconductor multilayer 20 (LED element) is demarcated in a process illustrated in FIG. 1F. However, without performing these processes, the outer edge of the LED element may be demarcated by the laser scribing or dicing in a process illustrated in FIG. 1I. In this case, the LED element eventually has a structure and shape illustrated in FIG. 1J.

Figure 1K:
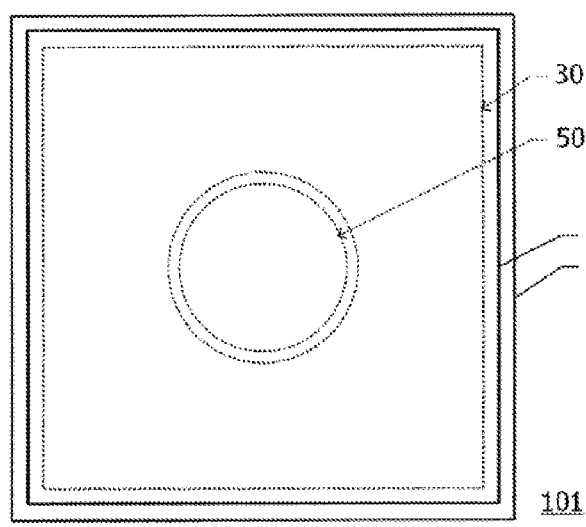
FIG. 1K is a plan view illustrating the first semiconductor light-emitting device.

FIG. 1K is a plan view (top view) illustrating the first LED element 101. The shape of the optical semiconductor multilayer 20 (or LED element 101) is a square shape in plan view in which one side thereof is substantially 1 mm.

The n-side electrode 50 (illustrated by a dashed line in FIG. 1K) is, for example, a circular shape in plan view, and disposed substantially in the center of the optical semiconductor multilayer 20 (or LED element 101). The shape of the n-side electrode 50 in plan view is not limited to a circular shape and, for example, may be a rectangular shape. In addition, one n-side electrode 50 may be formed, or a plurality of n-side electrodes may be formed. The p-side electrode 30 (illustrated by a dashed line in FIG. 1K) is formed to surround the n-side electrode 50.

FIG. 1I is referred to again. In a case in which the first LED element 101 is actually used, a bonding wire is respectively connected to the first part 72a and the second part 72b of the bonding layer 72. Electrons, which are supplied from an external power source through the bonding wire, are moved from the first part 72a of the bonding layer 72 to the n-side part 61 of the conductive layer 60, and further moved to the n-side electrode 50. In addition, electron holes, which are supplied from the external power source through the bonding wire are moved from the second part 72b of the bonding layer 72 to the p-side part 62 of the conductive layer 60, and further moved to the p-side electrode 30.

The electrons and electron holes injected from the p-side electrode 30 and the n-side electrode 50 to the optical semiconductor multilayer 20 are recombined in the active layer 23, and energy taken for this recombination is discharged as light (and heat). Part of the discharged light is directly output from the n-type semiconductor layer 22 side. In addition, another part thereof is reflected to the p-side electrode 30, and then output from the n-type semiconductor layer 22 side.

According to investigations by the inventors, it is found that if a separating position of the support substrate 71 is close to the optical semiconductor multilayer 20, stress, damage, or the like is applied to the optical semiconductor multilayer 20 at the time of being separated and peripheral edge portions of the optical semiconductor multilayer 20 do not emit light. In addition, it is found that a leakage current increases in the portion to which stress, damage, or the like is applied. According to further investigations of the inventors, it is found that the separating position of the support substrate 71 and the outer edge of the optical semiconductor multilayer 20 are apart from each other by 20 µm or more, which solves the problems described above.

Next, a second LED element which is discussed by the inventors will be described.

Figure 2A:
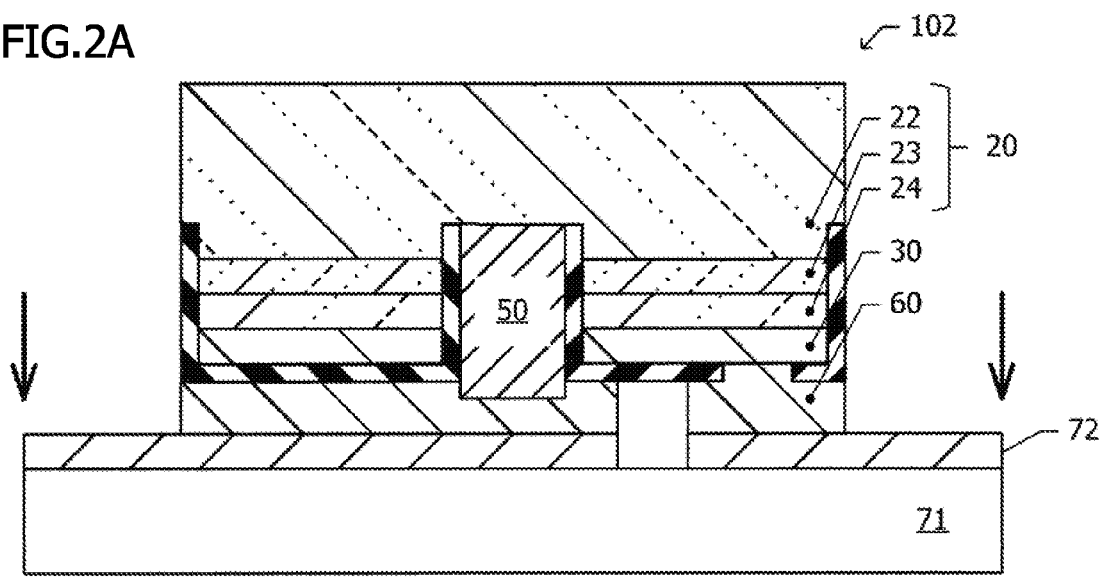
FIG. 2A is a sectional view illustrating a second semiconductor light-emitting device.

FIG. 2A is a sectional view illustrating a second LED element 102. In the second LED element 102, the separating position (or outer edge) of the support substrate 71 and the outer edge of the optical semiconductor multilayer 20 are apart from each other by 20 µm. The other configurations and structures are substantially the same as those of the first LED element 101. In the second LED element 102, since the separating position of the support substrate 71 and the outer edge of the optical semiconductor multilayer 20 are apart from each other, damage to the optical semiconductor multilayer 20 is reduced at the time of separating the substrate.

Figure 2B:
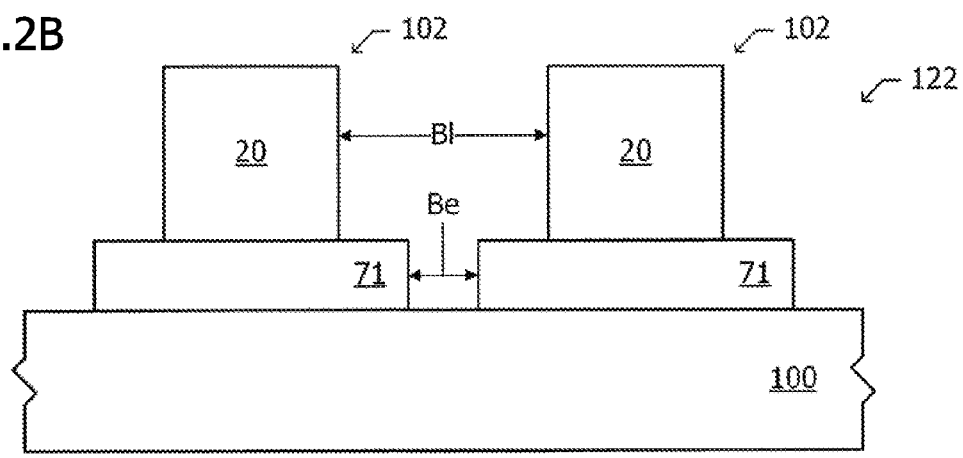
FIG. 2B is a sectional view schematically illustrating a semiconductor light-emitting device array which includes second semiconductor light-emitting devices.

FIG. 2B is a sectional view illustrating a part of a semiconductor light-emitting device array (LED array) 122 which includes a plurality of second LED elements 102. Illustration of the second LED element 102 is simplified, and the second LED element 102 is illustrated as a structure in which the optical semiconductor multilayer 20 is disposed on the support substrate 71.

In the LED array 122, the plurality of LED elements 102 (or the support substrate 71 demarcating a size of the LED element 102 in plan view) have an interval Be therebetween (for example, substantially 50 μm), and are disposed on a mounting substrate 100. At this time, the optical semiconductor multilayers 20 which become light emitting sources are disposed to have an interval BI therebetween (50 μm+20 μm×2=90 μm).

In the second LED element 102, in order to reduce the damage to the optical semiconductor multilayer 20 at the time of separating the substrate, the outer edge (separating position) of the support substrate 71 and the outer edge of the optical semiconductor multilayer 20 are relatively apart from each other. Accordingly, even when the interval Be between adjacent LED elements 102 (support substrates 71) is narrowed, the interval BI between adjacent optical semiconductor multilayers 20 becomes wide to a certain degree.

Figure 2C:
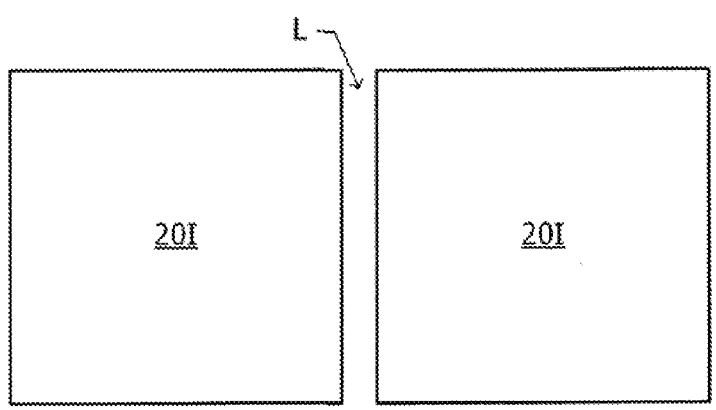
FIG. 2C is a plan view illustrating a projection image when light output from the semiconductor light-emitting device array is projected onto a screen.

FIG. 2C is a plan view illustrating a projection image 20I when light output from the LED array 122 is projected onto a screen. The projection image 20I corresponds to an image of light output from the second LED element 102 (in detail, the optical semiconductor multilayer 20 of the second LED element 102). In the LED array 122 using the second LED elements 102, since the interval BI between the adjacent optical semiconductor multilayers 20 becomes relatively wide, the interval between the projection images 20I is also widened, and as a result, a dark line L may appear in a gap between the projection images 20I. In a case in which the LED array is applied to a vehicle headlamp, or the like, it is preferable that such a dark line does not appear or does not substantially appear.

Next, a third LED element which is discussed by the inventors will be described.

Figure 3A:
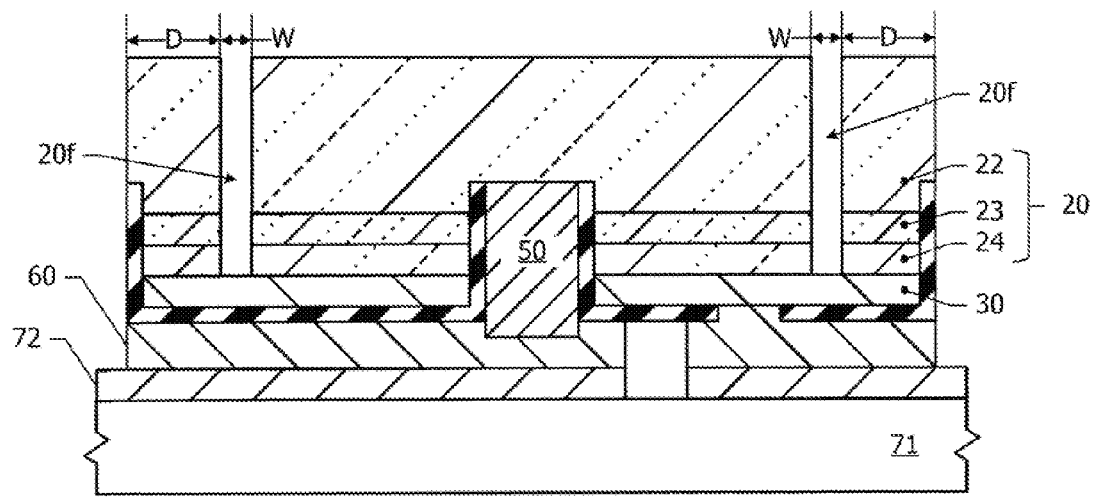
FIG. 3A and FIG. 3B are sectional views illustrating a state of manufacturing a third LED element.
Figure 3B:
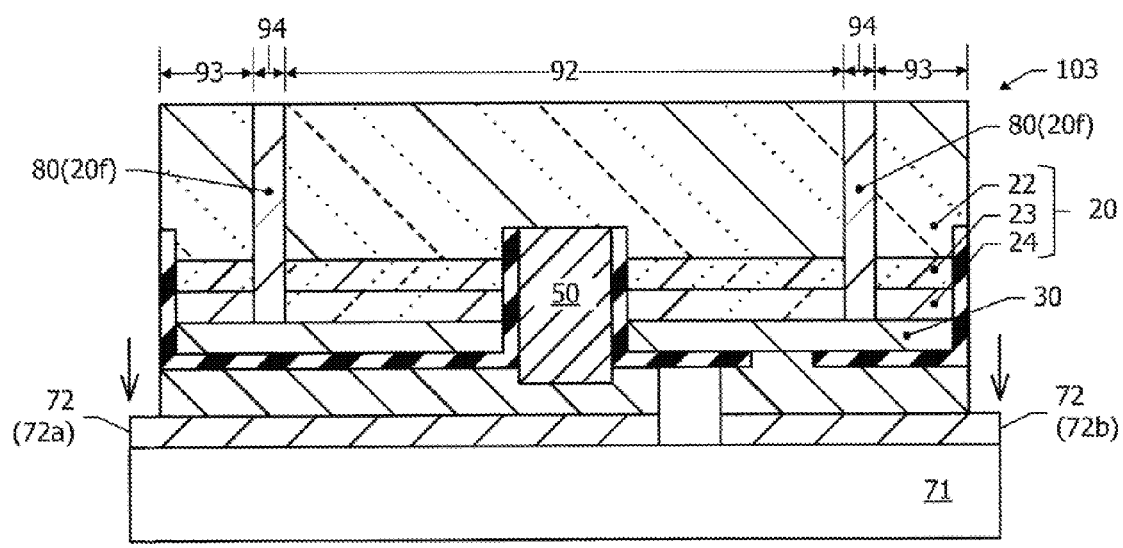

FIG. 3A and FIG. 3B illustrate a part of a state of manufacturing the third LED element. The third LED element is manufactured in the same manner as that of the first LED element, as follows: the device structure layer including the optical semiconductor multilayer is formed on the growth substrate (FIG. 1A to FIG. 1F), the device structure layer is bonded to the support substrate, and the growth substrate is separated from the device structure layer (FIG. 1G and FIG. 1H). After that, in the third LED element, a groove whose overall shape in plan view is a frame shape is formed in the optical semiconductor multilayer, and the frame-shaped groove is filled with a light-transmitting member, and the support substrate is divided in an appropriate size (FIG. 3A and FIG. 3B), thereby manufacturing the third LED element.

After separating the growth substrate 10 from the device structure layer 90 (refer to FIG. 1H), as illustrated in FIG. 3A, a frame-shaped groove 20f is formed in the optical semiconductor multilayer 20 by dry etching with chlorine gas using a resist mask. The frame-shaped groove 20f penetrates the n-type semiconductor layer 22, the active layer 23, and the p-type semiconductor layer 24, and is formed along the outer edge of the optical semiconductor multilayer 20.

A width W of the frame-shaped groove 20f is, for example, substantially 10 μm, and a distance D from the outer edge of the frame-shaped groove 20f to the outer edge of the optical semiconductor multilayer 20 is, for example, substantially 20 μm.

Next, as illustrated in FIG. 3B, the frame-shaped groove 20f is filled with a light-transmitting member 80. The light-transmitting member 80 is formed by, for example, injecting resin such as silicone into the frame-shaped groove 20f, and thermosetting (or ultraviolet-curing) the resultant. Moreover, a refractive index of the light-transmitting member 80 is preferably greater than at least the air (substantially 1.0), and is preferably more closer to the optical semiconductor multilayer 20 (GaN based semiconductor, substantially 2.4).

The light-transmitting member 80 is preferably in particular methyl phenyl silicone in which a part of side chains of polysiloxane is substituted by a phenyl group. This is because the refractive index is high. Other than this, inorganic materials such as silicon oxide, silicon nitride, titanium oxide, or zirconia can be used.

Finally, the support substrate 71 is divided along the outer edge of the optical semiconductor multilayer 20 by laser scribing or dicing, and each LED element 103 is obtained. In this way, the third LED element 103 is complete. In the third LED element 103, a region further inside than the light-transmitting member 80 is referred to as a main region 92, a region further outside than the light-transmitting member 80 is referred to as a peripheral edge region 93, and a region corresponding to the light-transmitting member 80 is referred to as a connection region 94.

Figure 3C:
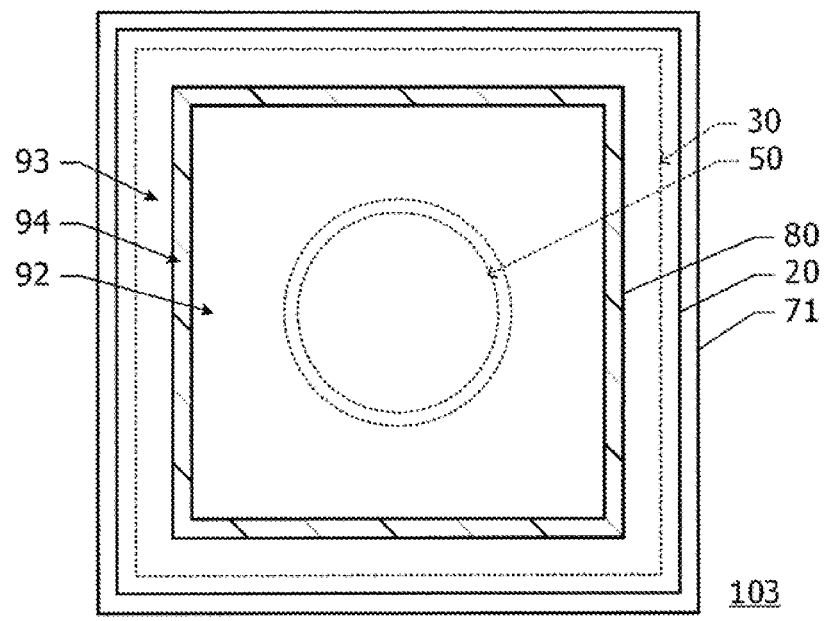
FIG. 3C is a plan view illustrating the third LED element.

FIG. 3C is a plan view (top view) illustrating the third LED element 103. The optical semiconductor multilayer 20 (or LED element 103) has a square shape in plan view in which one side thereof is substantially 1 mm. The light-transmitting member 80 (illustrated by a pattern of slanted lines in the drawing) is formed along the outer edge of the optical semiconductor multilayer 20, and has an overall frame shape in plan view.

The n-side electrode 50 (illustrated by a dashed line in FIG. 3C) is in contact with the n-type semiconductor layer 22 inside the main region (a region surrounded by the light-transmitting member 80) 92. In addition, the p-side electrode 30 (illustrated by a dashed line in FIG. 3C) is in contact with the p-type semiconductor layer 24 at least inside the main region 92. The p-side electrode 30 may be formed to extend to the peripheral edge region 93, or may be formed only inside the main region 92.

FIG. 3B is referred to again. If a current is injected to the optical semiconductor multilayer 20 from the bonding layer 72 or the conductive layer 60 through the p-side electrode 30 and the n-side electrode 50, the current flows in the optical semiconductor multilayer 20 corresponding to the main region 92; however, the current does not flow in the optical semiconductor multilayer 20 corresponding to the peripheral edge region 93. Therefore, at the time of separating the substrate, even if damage is applied to peripheral edge portions of the optical semiconductor multilayer 20, leakage current in the portions does not increase.

Meanwhile, the optical semiconductor multilayer 20 corresponding to the main region 92 emits light because the current flows thereinside; however, the optical semiconductor multilayer 20 corresponding to the peripheral edge region 93 does not emit light because the current does not flow therein. However, the light discharged from the active layer 23 of the main region 92 is output from the surface of the n-type semiconductor layer 22 of the main region 92 and is guided to the n-type semiconductor layer 22 of the peripheral edge region 93 through the light-transmitting member 80, and the light is output from the surface thereof.

A member having a refractive index larger than the air (outside air) is used for the light-transmitting member 80. Therefore, light reflecting on an interface between the optical semiconductor multilayer 20 and the light-transmitting member 80 is reduced, and light is likely to be further propagated to the peripheral edge region 93. After that, the light is propagated further toward the peripheries of the element in the peripheral edge region 93. That is, light is output from the entire surface of the n-type semiconductor layer 22 (the entirety of the optical semiconductor multilayer 20 or the entirety of the LED element 103).

Figure 3D:
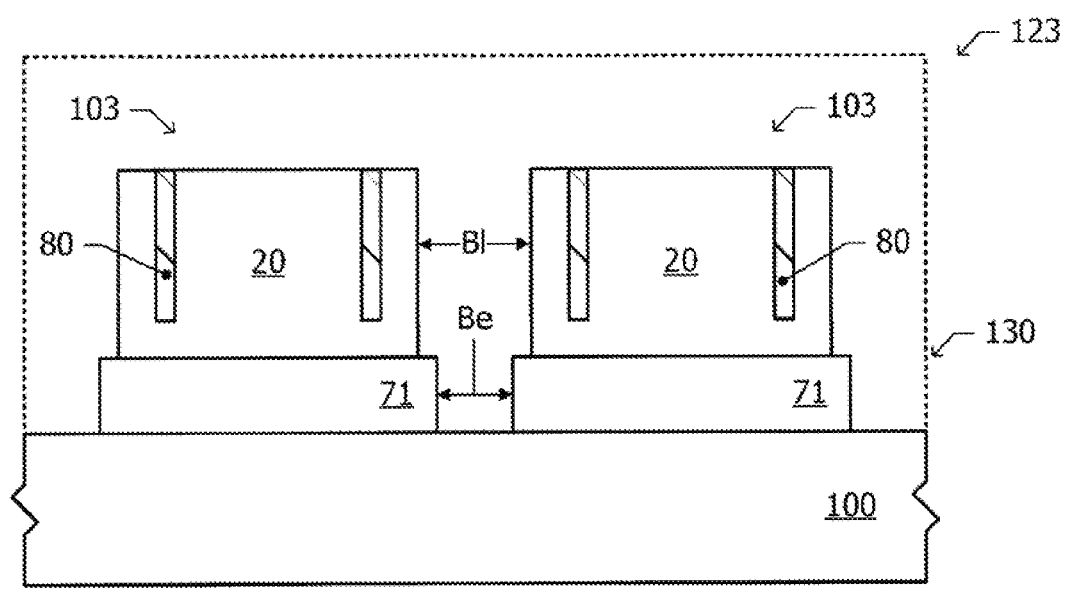
FIG. 3D and FIG. 3E are respectively a sectional view and a plan view schematically illustrating a semiconductor light-emitting device array which includes third semiconductor light-emitting devices.

FIG. 3D is a sectional view illustrating a part of a LED array 123 which includes a plurality of third LED elements 103. A case is assumed in which light output from the LED array 123 (third LED element 103) is projected onto a screen.

In the third LED element 103, as described above, light is output from the entire surface of the optical semiconductor multilayer 20 including the peripheral edge region (region further outside than the light-transmitting member 80). In addition, the outer edge of the optical semiconductor multilayer 20 substantially coincides with the separating position of the support substrate 71 (outer edge), and a difference between the interval BI between the optical semiconductor multilayers 20 and the interval Be between the LED elements 103 (or support substrates 71) is extremely small.

From these characteristics, in the LED array 123 which uses the third LED elements 103, an interval between the projection images can be relatively freely adjusted. That is, while suppressing an increase of the leakage current, the interval between the projection images can be easily adjusted so as not to generate dark lines.

Figure 3E:
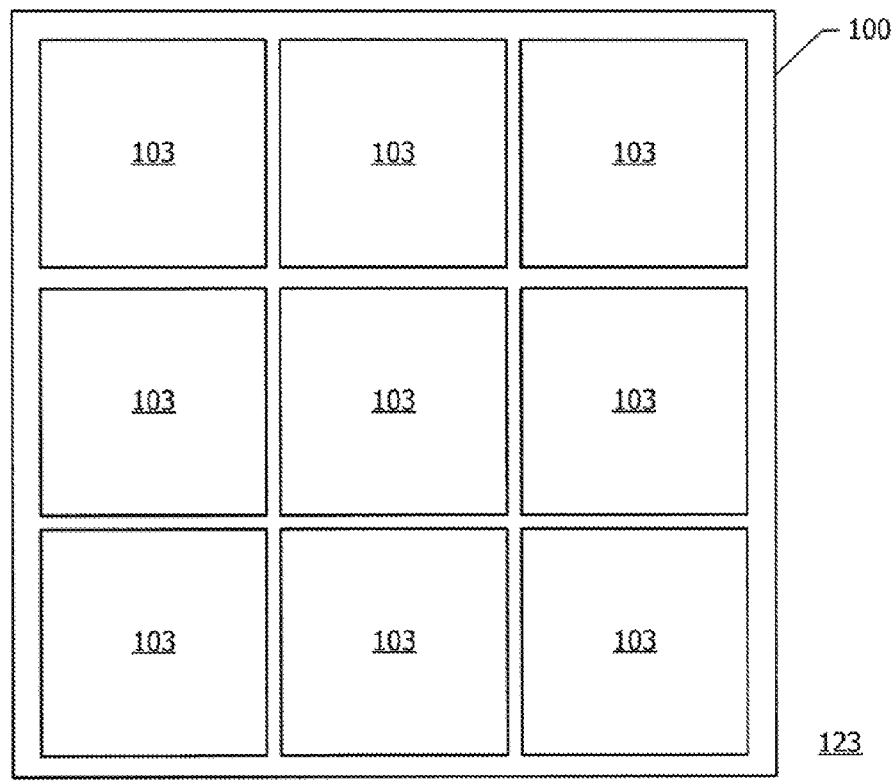

FIG. 3E is a plan view (top view) illustrating the LED array 123. The LED array 123 can be manufactured, for example, as described below.

First, a plurality of LED elements 103 are disposed on a mounting substrate 100. The plurality of LED elements 103 are arranged in, for example, a matrix of 3 rows and 3 columns. As the mounting substrate 100, for example, a Si substrate or an AlN substrate is used. In addition, Ag paste, or the like is used for fixing the LED element 103.

After that, by wire bonding, a wire (for example, Au wire) is connected to each electrode in the LED element 103 (first part 72a and second part 72b of bonding layer 72 in FIG. 3B), and the wire is drawn out to the outside. The drawn wire is connected to an external power source, an external controller circuit controlling on/off of the LED element 103, and the like.

Figure 3F:
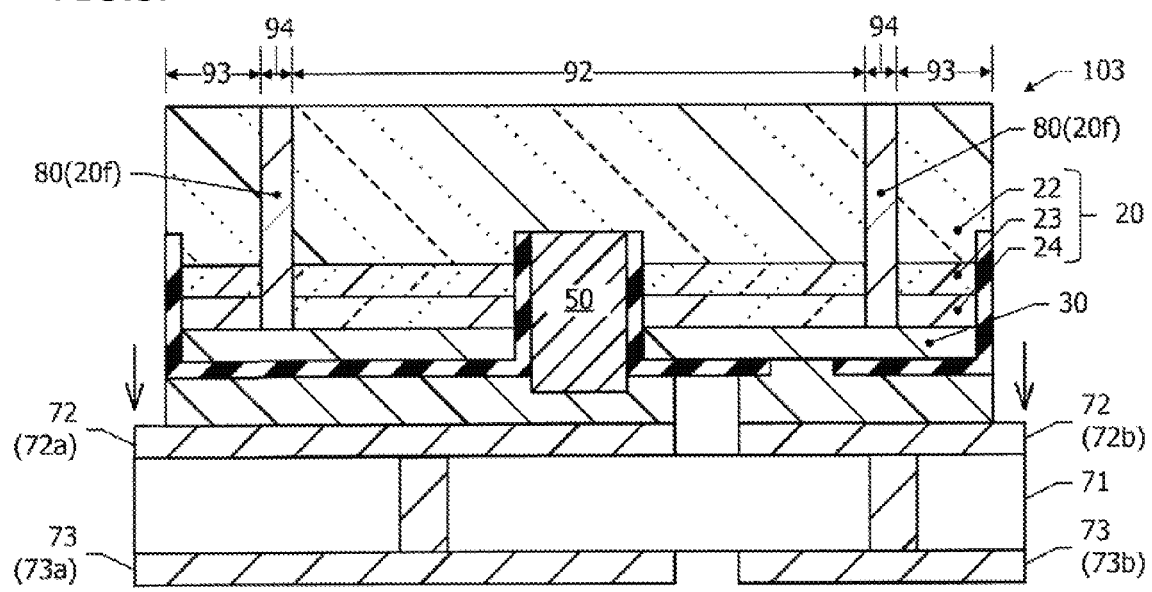
FIG. 3F is a sectional view illustrating a modification example of the third semiconductor light-emitting device.

FIG. 3F is a sectional view illustrating a modification example of the LED element 103. Electrical connection to an external power source or the like is not limited to connection through the bonding wire, and may be connection through a wiring pattern to be formed on the mounting substrate 100 (FIG. 3E). In this case, as illustrated in FIG. 3F, a penetrating substrate is adopted to the support substrate 71, and rear electrodes 73a and 73b, which are electrically connected to the first part 72a and the second part 72b of the bonding layer 72, are provided in a rear surface of the support substrate 71. According to such a configuration, the electrodes of the LED element 103 can be easily connected to the wiring pattern on the mounting substrate 100.

In this way, the LED array 123 is complete. Moreover, after that, a protection layer 130 covering the plurality of LED elements 103 may be formed on the mounting substrate 100.

As the protection layer 130, for example, resin such as silicone can be used. Particularly, dimethyl based silicone having a methyl group at all of side chains and terminals of polysiloxane is preferred. This is because, heat resistance is high. In addition, in the protection layer 130, for example, a yellow phosphor or the like may be added. Accordingly, white light can be output from the LED array 123.

Figure 4A:
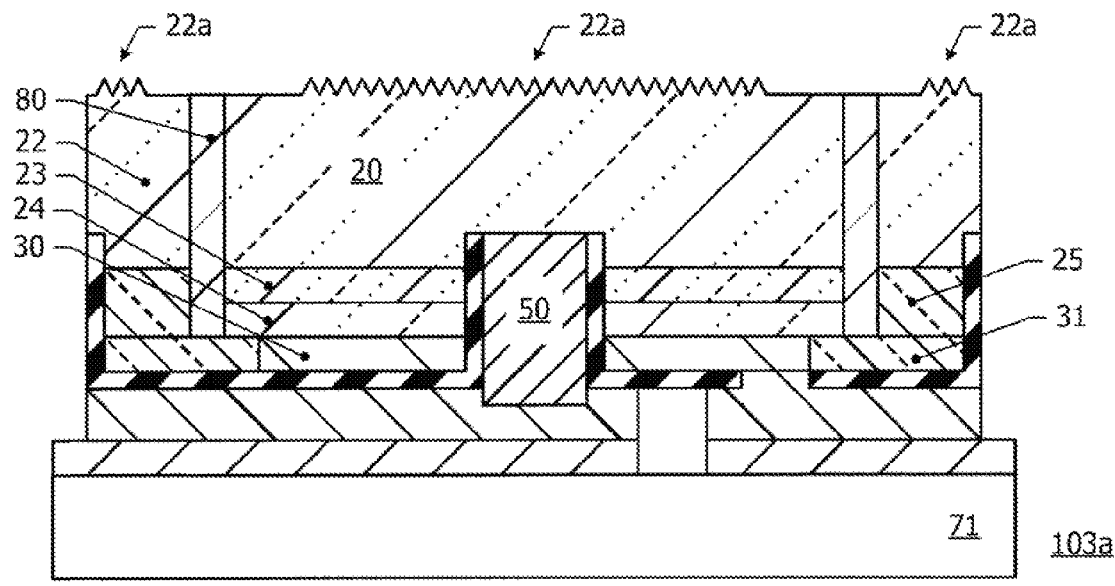
FIG. 4A and FIG. 4B are respectively a sectional view and a plan view illustrating a modification example of the third semiconductor light-emitting device.

FIG. 4A is a sectional view illustrating a modification example 103a of the third LED element 103.

A fine uneven structure may be formed in a surface of the n-type semiconductor layer 22 in order to promote extraction of light. The fine uneven structure may be, for example, a so-called micro-cone structure. The micro-cone structure 22a can be formed by separating the growth substrate 10 from the optical semiconductor multilayer 20 (refer to FIG. 1H), and then wet-etching the exposed surface of the n-type semiconductor layer 22 using, for example, trimethyl phenyl ammonium hydroxide (TMAH) aqueous solution (temperature is substantially 70° C., and concentration is substantially 25%). An average size of the micro-cones is preferably 450 μm or more. If an average height of the micro-cones is greater than a wavelength of emitted light, the light recognizes the micro-cones as unevenness. Light can be efficiently output from the optical semiconductor multilayer 20 to the outside by the micro-cone structure 22a.

The micro-cone structure 22a may be patterned to be a predetermined shape in plan view. The structure may be formed in only the main region (region further inside than light-transmitting member 80), or as illustrated in FIG. 4A, may be formed in a region other than a vicinity of the light-transmitting member 80.

When a vicinity of the light-transmitting member 80 of the main region is made to be a planar surface, light generated in the main region can be guided further to the peripheral edge region by a total reflection of the light. In addition, when the vicinity of the light-transmitting member 80 of the peripheral edge region is made to be a planar surface, even inside the peripheral edge region, the light can be guided to a further end portion by the total reflection.

Accordingly, by performing patterning illustrated in FIG. 4A, light discharged from the vicinity of the light-transmitting member 80 in the main region can be actively output from the further outside than the peripheral edge region. Both of the main region and the peripheral edge region have a planar region in FIG. 4A; however, a planar region may be formed in any one of the main region and the peripheral edge region.

In addition, the active layer 23 and the p-type semiconductor layer 24 corresponding to the peripheral edge region (region further outside than the light-transmitting member 80) may be substituted for a light-transmitting layer 25. The light-transmitting layer 25 can be formed by forming the optical semiconductor multilayer 20 (refer to FIG. 1A), then removing the p-type semiconductor layer 24 and the active layer 23 corresponding to the peripheral edge region, and backfilling the removed region with silicon oxide, silicon nitride, or the like.

While the active layer 23 of the peripheral edge region does not contribute to light emission, light guided from the main region to the peripheral edge region is slightly absorbed. Therefore, there is a possibility that intensity of the light output from the peripheral edge region is reduced. When at least the active layer 23 of the peripheral edge region is substituted for the light-transmitting layer 25 made of silicon oxide, silicon nitride, or the like, reduction of the light intensity in the peripheral edge region can be suppressed.

Further, from the main region to the peripheral edge region, a part of the p-side electrode 30 may be substituted for a light extraction layer 31. The light extraction layer 31 can be formed of, for example, silicon oxide, silicon nitride, titanium oxide, zirconia, or the like. From the main region to the peripheral edge region, by substituting the p-side electrode 30 for the light extraction layer 31, light emitted from the main region is guided to the peripheral edge region through the light-transmitting member 80 and the light extraction layer 31.

Figure 4B:
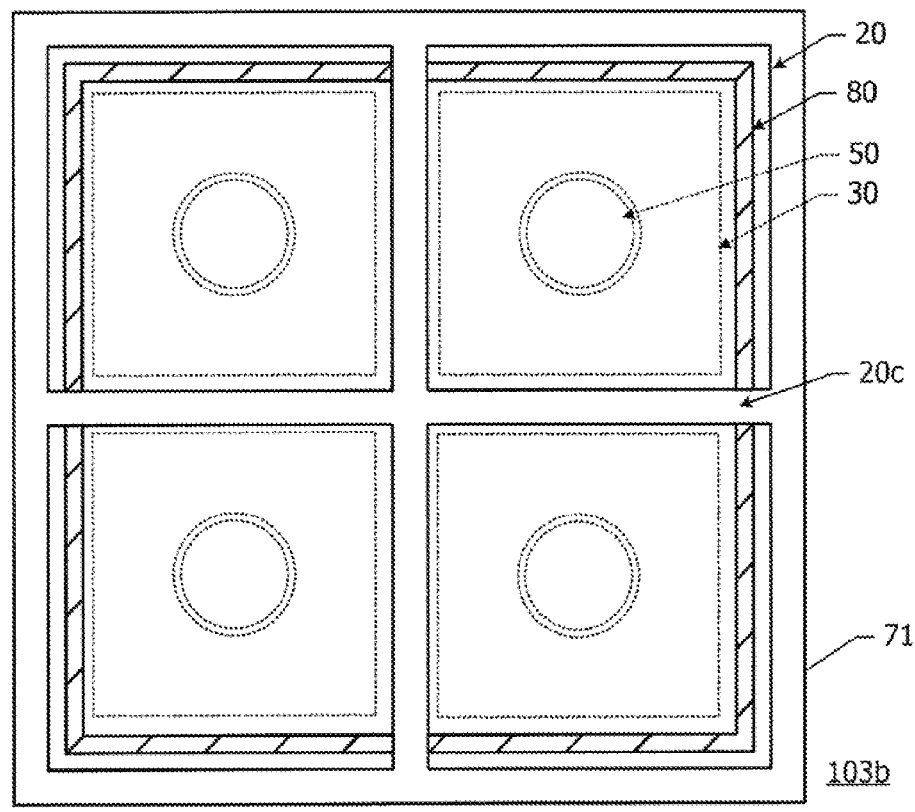

FIG. 4B is a plan view illustrating another modification example 103*b* of the third LED element 103. In the optical semiconductor multilayer 20, for example, a cross-shaped division groove 20*c* is provided, and the optical semiconductor multilayer 20 may be divided into four regions (segments). In each of the four segments, the p-side electrode 30 and the n-side electrode 50 are provided, and current independently flows in the four segments to independently emit light (be controlled to be on/off).

Adjacent segments are not divided by laser scribing or dicing. Accordingly, the light-transmitting member 80 does not need to be provided along an outer edge of each of the segments, and may be provided along the outer edge of the optical semiconductor multilayer 20. Moreover, the light-transmitting member 80 may be provided along any one of the outer edges of the optical semiconductor multilayer 20.

Figure 4C:
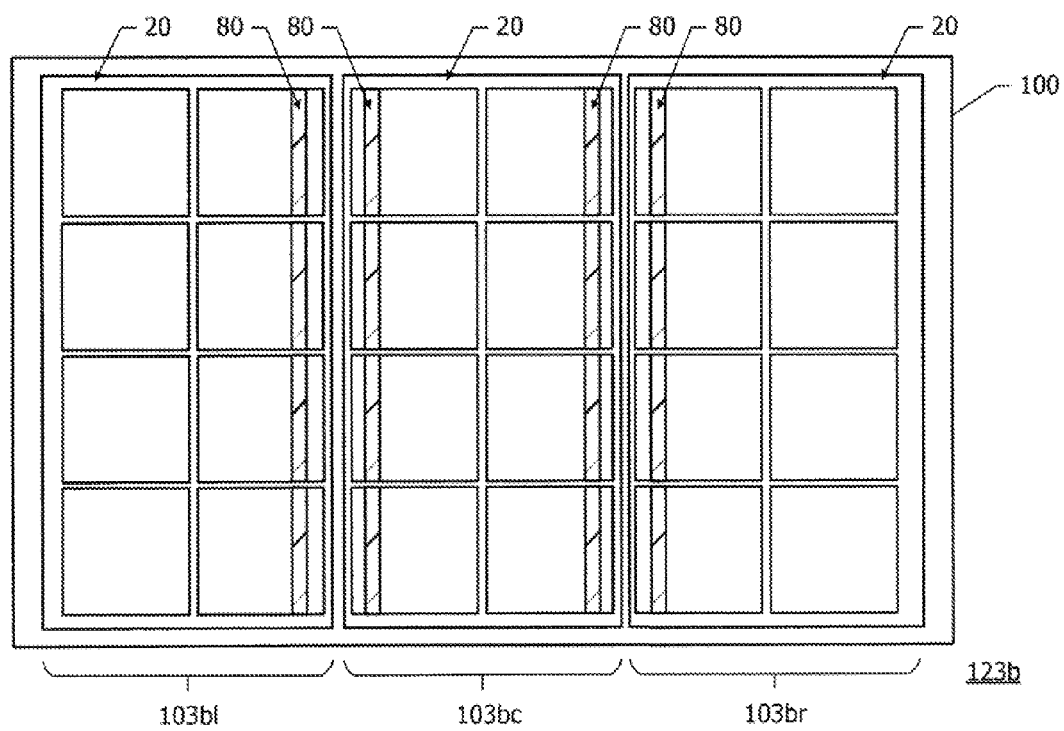
FIG. 4C is a plan view schematically illustrating a semiconductor light-emitting device array which includes third semiconductor light-emitting devices of the modification example.

FIG. 4C is a plan view illustrating an LED array 123*b* which includes a plurality of LED elements 103*b* including a plurality of segments. On the mounting substrate 100, for example, three LED elements 103*bl*, 103*bc*, and 103*br* are arranged in one direction. Each of the LED elements 103*b* includes, for example, eight segments.

In this case, the light-transmitting member 80 is formed in each segment along a side where the elements face each other. Each light-transmitting member 80 is formed along one side in the left element 103*bl* and the right element 103*br*, and is formed along a right side and a left side in an arrangement direction in the center element 103*bc*. The light-transmitting member 80 is not formed on sides (sides of top and bottom and sides outside the left LED element 103*bl* and the right LED element 103*br*) along peripheries of the LED array. The member may not be provided because a dark line is not generated between the elements in such a position, and a distance between the support substrate and the optical semiconductor multilayer 20 may be sufficiently maintained even when dividing the substrate.

Elements having a structure such as that of the center element 103*bc* alone may be arranged in a row for easy manufacturing. Regarding two regions divided by the light-transmitting member 80 of each segment, a region of a side where the elements face each other (a region nearer to the adjacent elements) is a non light-emitting region corresponding to the outer edge (periphery) region, and a region of a side reverse to the side where the elements face each other (a region further away from the adjacent elements) is a light-emitting region corresponding to the main region with the electrode formed therein.

In a case in which the optical semiconductor multilayer 20 is divided into more segments, a multilayer wiring substrate may be used for the support substrate 71. For example, if the n-side electrodes, which are respectively connected to the segments, are mutually connected to each other so as to have a common potential, and the p-side electrodes, which are respectively connected to the segments, are respectively connected to an inner layer (inter layer) wire, current can independently flow in each segment (so as to control on and off).

Even in a case of dividing the layer into the plurality of segments, in each of the segments, as illustrated in FIG. 4A, the vicinity of the light-transmitting member 80 may be made of a planar surface in two regions divided by grooves, and the other regions may be formed with patterned micro-cones. In addition, the light extraction layer 31 may be further provided. Furthermore, the active layer 23 and the p-type semiconductor layer 24 may be substituted for the light-transmitting layer 25 in a non light-emitting region.

Next, a fourth LED element which is discussed by the inventors will be described.

Figure 5A:
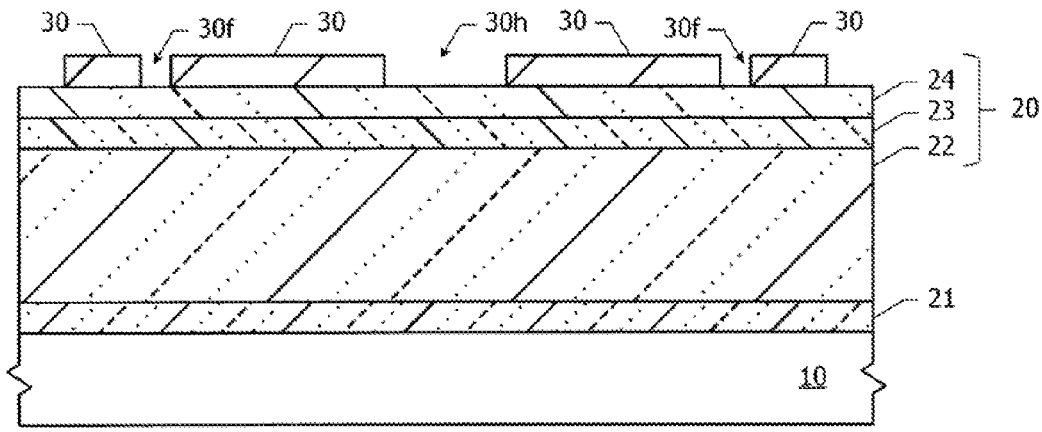
FIG. 5A to FIG. 5F are sectional views illustrating a state of manufacturing a fourth semiconductor light-emitting device.
Figure 5B:
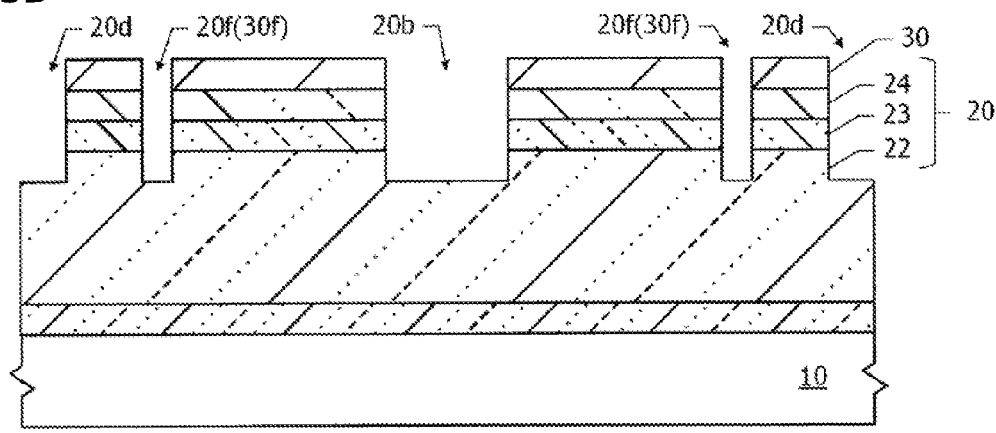
Figure 5C:
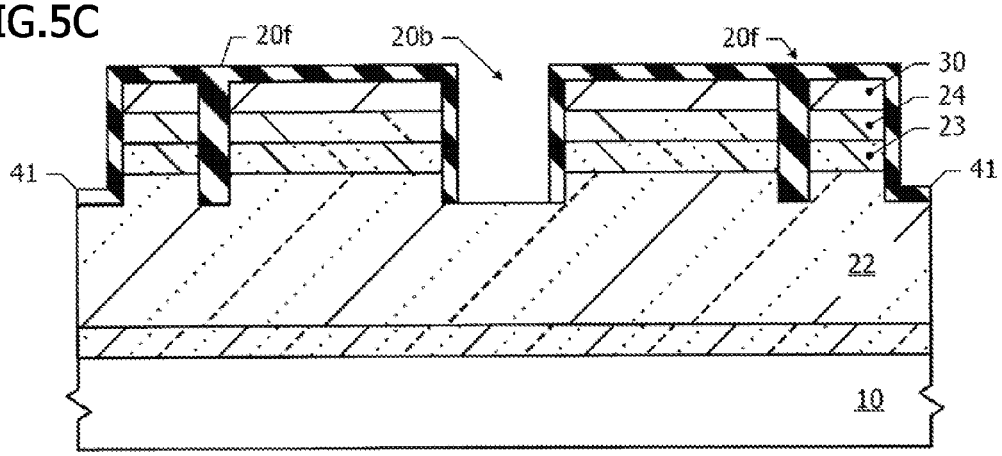
Figure 5D:
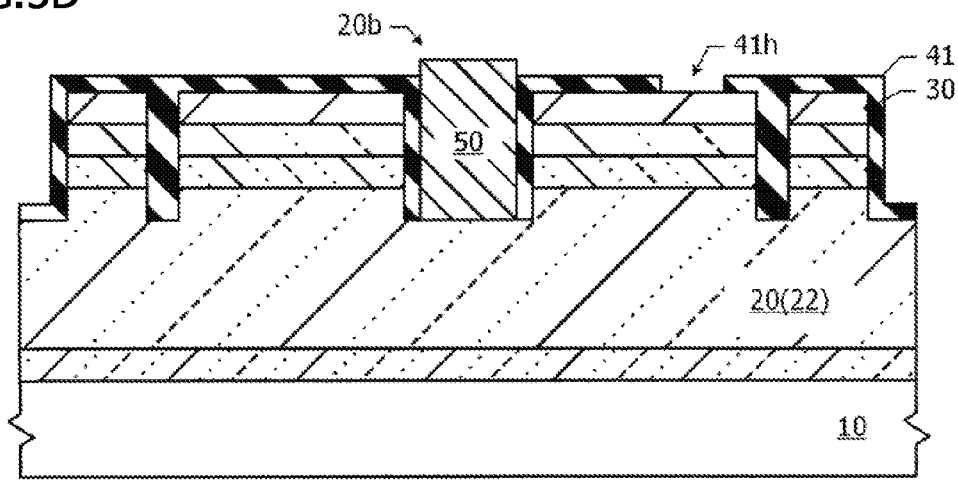
Figure 5E:
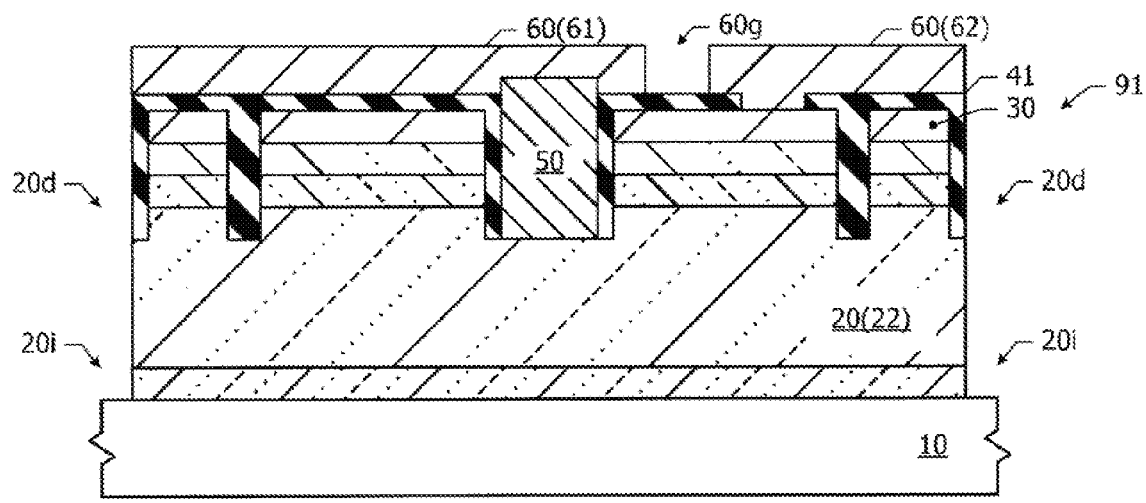
Figure 5F:
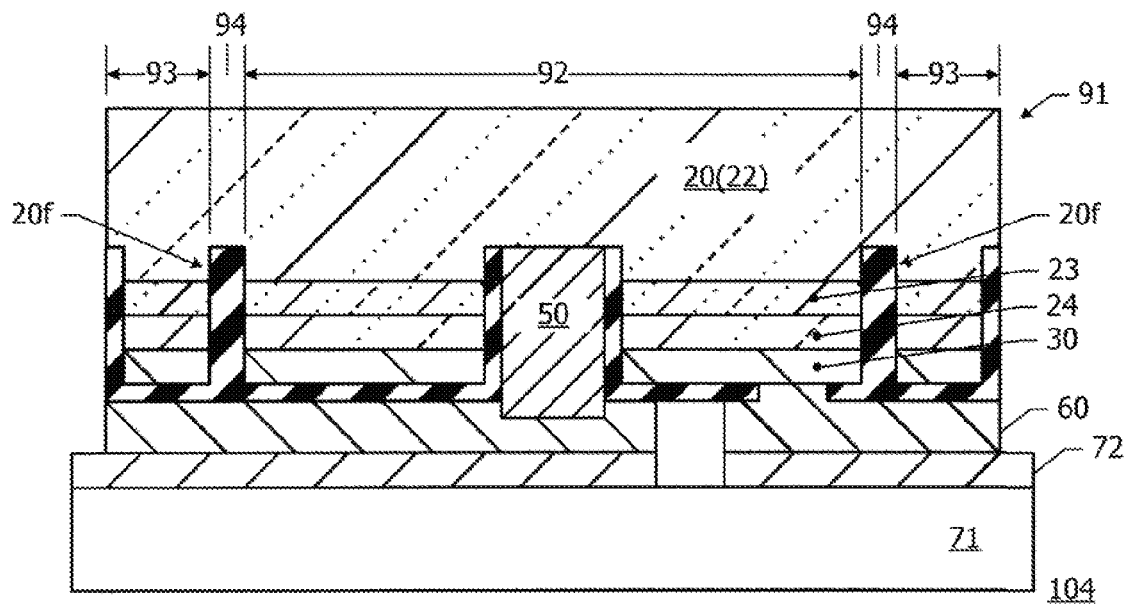

FIG. 5A to FIG. 5F illustrate a part of a state of manufacturing the fourth LED element. The fourth LED element is mainly manufactured, as follows; the device structure layer including the optical semiconductor multilayer in which a groove whose overall shape in plan view is frame shape is formed, electrodes, and the like is formed on the growth substrate (FIG. 5A to FIG. 5E), the device structure layer is bonded to the support substrate, the growth substrate is separated from the device structure layer, and finally, the support substrate is divided in an appropriate size (FIG. 5F).

First, as illustrated in FIG. 5A, on the growth substrate 10, the optical semiconductor multilayer 20 is formed on the underlying buffer layer 21. After that, the p-side electrode (surface electrode) 30 including the openings 30*h* and 30*f* is formed on a surface of the optical semiconductor multilayer 20 (p-type semiconductor layer 24). The opening 30*h* has, for example, a circular shape in plan view. In addition, the opening 30*f* has an overall shape of a frame shape in plan view.

Next, as illustrated in FIG. 5B, regions of the optical semiconductor multilayer 20 where the p-side electrode 30 is not formed, that is, regions corresponding to the openings 30*h* and 30*f* and regions further outside than the p-side electrode 30 are removed by dry etching with chlorine gas using a resist mask. Accordingly, the via 20*b*, the frame-shaped groove 20*f*, and the outer groove 20*d* are formed in the optical semiconductor multilayer 30. The via 20*b*, the frame-shaped groove 20*f*, and the outer groove 20*d* penetrate at least the p-type semiconductor layer 24 and the active layer 23, and the n-type semiconductor layer 22 is exposed at the bottom surfaces thereof.

Next, as illustrated in FIG. 5C, the float layer 40 is formed in a region other than the bottom surface of the via 20*b*. First, a $SiO_2$ film is formed on an entire upper surface of the optical semiconductor multilayer 20 including the p-side electrode 30 by sputtering or the like. Subsequently, the $SiO_2$ film, which is formed on the bottom surface of the via 20*b*, is etched by dry etching with $CF_4$/Ar mixed gas using a resist mask. Accordingly, the $SiO_2$ film, which covers at least the p-side electrode 30, a side surface of the via 20*b*, and a side surface and a bottom surface of the frame-shaped groove 20*f* (fills inside the frame-shaped groove 20*f*), that is, a float layer 41 is formed.

Next, as illustrated in FIG. 5D, the n-side electrode (via electrode) 50 is formed inside the via 20*b*. After that, by dry etching with chlorine gas using a resist mask, a part of the float layer 41 positioned on the upper side of the p-side electrode 30 is removed, and a part of the p-side electrode 30 is exposed (contact hole 41*h*).

Next, as illustrated in FIG. 5E, the conductive layer 60 is formed with the gap 60*g* on the float layer 41. The conductive layer 60 includes the n-side part 61 and the p-side part 62. After that, by dry etching with chlorine gas using a resist mask, the separating groove 20*i* which penetrates the float layer 41 and the optical semiconductor multilayer 20 (n-type semiconductor layer 22) is formed in the outer groove 20d. In this way, the device structure layer 91 is formed on the growth substrate 10.

After that, as illustrated in FIG. 5F, the device structure layer 91 is attached to the support substrate 71, and the device structure layer 91 is separated from the growth substrate 10 by a laser lift-off process. Finally, the support substrate 71 is divided along the outer edge of the optical semiconductor multilayer 20, and each of the LED elements 104 is obtained.

In this way, the fourth LED element 104 is complete. In the fourth LED element 104, a region further inside than the frame-shaped groove 20f (or the float layer which fills the groove) corresponds to the main region 92, a region further outside than the frame-shaped groove 20f corresponds to the peripheral edge region 93, and a region corresponding to the frame-shaped groove 20f corresponds to the connection region 94.

Figure 5G:
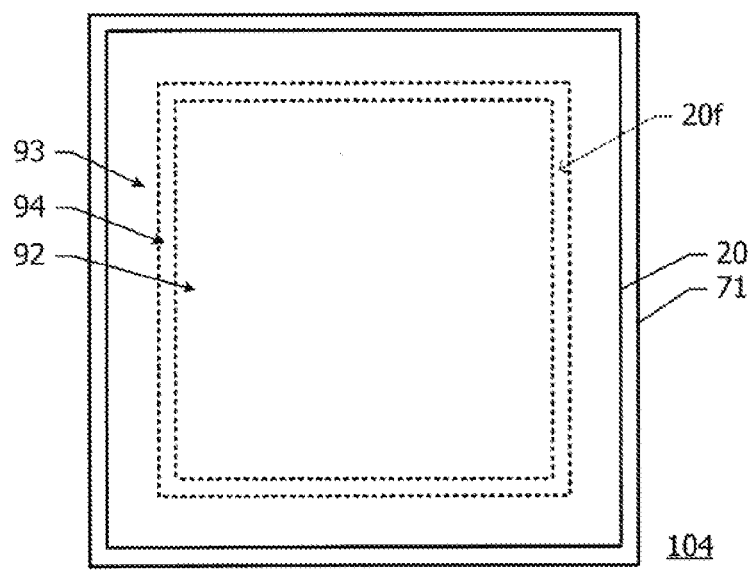
FIG. 5G is a plan view illustrating the fourth semiconductor light-emitting device.

FIG. 5G is a plan view (top view) illustrating the fourth LED element 104. The frame-shaped groove 20f (illustrated by a dashed line) is formed along the outer edge of the optical semiconductor multilayer 20, and has an overall shape of a frame shape in plan view.

FIG. 5F is referred to again. If a current is applied to the optical semiconductor multilayer 20 from the bonding layer 72 or the conductive layer 60 through the p-side electrode 30 and the n-side electrode 50, the current flows to the optical semiconductor multilayer 20 corresponding to the main region 92; however, the current does not flow to the optical semiconductor multilayer 20 corresponding to the peripheral edge region 93. In the same manner as that of the third LED element 103, at the time of separating the substrate, even if damage is applied to the peripheral edge portions of the optical semiconductor multilayer 20, leakage current in the portions does not increase.

Meanwhile, the n-type semiconductor layer 22 is continuously formed in the fourth LED element 104 from the main region 92 to the peripheral edge region 93. Accordingly, light discharged from the main region 92 may be efficiently guided to the peripheral edge region 93.

The fourth LED elements 104 can be arranged in the same manner to provide an LED array as illustrated in FIG. 3E, and can also be an element such as the element divided into a plurality of segments as illustrated in FIG. 4B. Further, it can be the LED array in which elements divided into the plurality of segments are arranged as illustrated in FIG. 4C. In such a case, a position of the light-transmitting member 80 corresponds to a position of a groove 20f.

In addition, in two regions divided by such a groove as illustrated in FIG. 4A, a vicinity of the directly upper side of the groove 20f in a light-emitting surface, that is, a vicinity of a boundary of the regions divided by the groove may be made to be a planar surface, and patterned micro-cones may be formed on the other regions. Further, the light extraction layer 31 may further be provided under the groove 20f, and the active layer 23 and the p-type semiconductor layer 24 may be substituted for the light-transmitting layer 25 in a non light-emitting region.

Hitherto, the invention has been described with reference to the first to the fourth LED elements; however, the invention is not limited thereto. It is apparent to those skilled in the art that various modifications, improvements, combinations, and the like can be performed thereto.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the invention have been described in detail, it should be understood that the various changes, substitutions, and alterations could be made hereto without departing from the spirit and scope of the invention.

What are claimed are:

1. A semiconductor light-emitting device comprising:
a support substrate;
an optical semiconductor multilayer disposed above the support substrate, wherein:
the optical semiconductor multilayer has a structure in which a first semiconductor layer having a first conductivity type, an active layer having light emitting properties, and a second semiconductor layer having a second conductivity type different from the first conductivity type are sequentially stacked from the support substrate side,
a groove, which has a height exceeding at least the active layer from the support substrate side, is formed along an outer edge of the optical semiconductor multilayer, and
the optical semiconductor multilayer includes an external region which is a region provided outside of the groove, an inner region which is a region provided inside of the groove, and a connection region corresponding to a region where the groove is provided, when viewed in plan view;
a first electrode disposed between the support substrate and the optical semiconductor multilayer and having a portion in contact with the first semiconductor layer in the inner region, wherein the first electrode overlaps the groove; and
a second electrode disposed between the support substrate and the optical semiconductor multilayer, the second electrode having a portion which penetrates the first electrode, the first semiconductor layer, and the active layer, and the second electrode being in contact with the second semiconductor layer, in the inner region,
wherein, in the optical semiconductor multilayer, the connection region includes a member having a refractive index greater than air, and the member causes the second semiconductor layer in the inner region to be coupled to the second semiconductor layer in the external region.

2. The semiconductor light-emitting device according to claim 1,
wherein the connection region includes the same member as the second semiconductor layer, and the second semiconductor layer is continuously formed from the inner region to the external region.

3. The semiconductor light-emitting device according to claim 1, wherein, in the optical semiconductor multilayer, the groove is formed to penetrate the first semiconductor layer, the active layer, and the second semiconductor layer, and
wherein the connection region comprises a light-transmitting member which fills the groove and which has a refractive index equal to or less than a refractive index of the optical semiconductor multilayer.

4. The semiconductor light-emitting device according to claim 1,
wherein, on an upper surface of the second semiconductor layer, an uneven structure which is patterned to be a predetermined planar shape is provided and a flat surface is provided in a vicinity of the connection region.

5. The semiconductor light-emitting device according to claim 1, wherein the optical semiconductor multilayer has:
   a structure in which the first semiconductor layer, the active layer, and the second semiconductor layer are sequentially stacked from the support substrate side in the inner region, and
   a structure in which a light-transmitting layer and the second semiconductor layer are sequentially stacked from the support substrate side in the external region.

6. The semiconductor light-emitting device according to claim 1, further comprising:
   a light extraction layer disposed between the support substrate and the optical semiconductor multilayer so as to be in contact with the optical semiconductor multilayer, the light extraction layer being formed from the inner region to the external region.

7. A semiconductor light-emitting device array comprising:
   a mounting substrate;
   a plurality of semiconductor light-emitting devices disposed on the mounting substrate; and
   a protection layer covering the plurality of semiconductor light-emitting devices and including a phosphor material,
   wherein each of the semiconductor light-emitting devices includes:
      a support substrate,
      an optical semiconductor multilayer disposed above the support substrate, wherein:
         the optical semiconductor multilayer has a structure in which a first semiconductor layer having a first conductivity type, an active layer having light emitting properties, and a second semiconductor layer having a second conductivity type different from the first conductivity type are sequentially stacked from the support substrate side,
         a groove, which has a height exceeding at least the active layer from the support substrate side, is formed in the optical semiconductor multilayer along a side close to an adjacent semiconductor light-emitting device, and
         the optical semiconductor multilayer includes an outer region which is a region closer to the adjacent semiconductor light-emitting device than the groove, a main region which is a region further away from the adjacent semiconductor light-emitting device than the groove, and a connection region corresponding to a region where the groove is provided, when viewed in plan view,
      a first electrode disposed between the support substrate and the optical semiconductor multilayer and having a portion in contact with the first semiconductor layer in the main region,
      a second electrode disposed between the support substrate and the optical semiconductor multilayer, the second electrode having a portion which penetrates the first electrode, the first semiconductor layer, and the active layer, and the second electrode being in contact with the second semiconductor layer, in the main region, and
      a light extraction layer overlapping the groove.

8. The semiconductor light-emitting device array according to claim 7, wherein, in the optical semiconductor multilayer, the groove is formed to penetrate the first semiconductor layer, the active layer, and the second semiconductor layer, and
   wherein each of the plurality of semiconductor light-emitting devices further includes a light-transmitting member which fills the groove and which has a refractive index equal to or more than a refractive index of air.

9. The semiconductor light-emitting device array according to claim 8,
   wherein the light-transmitting member is different from a member constituting the protection layer.

10. The semiconductor light-emitting device array according to claim 7,
    wherein the connection region includes the same member as the second semiconductor layer, and the second semiconductor layer is continuously formed from the main region to the outer region.

11. The semiconductor light-emitting device array according to claim 7,
    wherein, on an upper surface of the second semiconductor layer, an uneven structure which is patterned to be a predetermined planar shape is provided and a flat surface is provided in a vicinity of the connection region.

12. The semiconductor light-emitting device array according to claim 7, wherein the optical semiconductor multilayer has:
    a structure in which the first semiconductor layer, the active layer, and the second semiconductor layer are sequentially stacked from the support substrate side in the main region, and
    a structure in which a light-transmitting layer and the second semiconductor layer are sequentially stacked from the support substrate side in the outer region.

13. The semiconductor light-emitting device array according to claim 7, wherein the light extraction layer is disposed between the support substrate and the optical semiconductor multilayer so as to be in contact with the optical semiconductor multilayer, and is formed from the main region to the outer region.

* * * * *